(12) United States Patent
Martini

(10) Patent No.: US 6,605,977 B2
(45) Date of Patent: Aug. 12, 2003

(54) CIRCUIT FOR CURRENT INJECTION CONTROL IN ANALOG SWITCHES

(75) Inventor: Marco Martini, Acireale (IT)

(73) Assignee: STMicroelectronics, s.r.l., Milan (IT)

(*) Notice: Subject to any disclaimer, the term of this patent is extended or adjusted under 35 U.S.C. 154(b) by 0 days.

(21) Appl. No.: 09/982,529

(22) Filed: Oct. 17, 2001

(65) Prior Publication Data

US 2002/0067199 A1 Jun. 6, 2002

(30) Foreign Application Priority Data

Oct. 19, 2000 (EP) .............................. 00830677

(51) Int. Cl.[7] .............................................. H03K 17/687
(52) U.S. Cl. ...................................... 327/427; 326/113
(58) Field of Search ................... 327/379–382, 327/389, 391, 427, 431, 430, 434, 436, 437, 376, 377; 326/113

(56) References Cited

U.S. PATENT DOCUMENTS

| 4,985,647 A | * | 1/1991 | Kawada ..................... 326/113 |
| 5,023,688 A | * | 6/1991 | Ando et al. ................. 327/379 |
| 5,111,072 A |   | 5/1992 | Seidel ........................ 327/382 |
| 5,298,817 A | * | 3/1994 | Banak et al. ............... 327/427 |
| 5,666,082 A |   | 9/1997 | Wilenken et al. .......... 327/404 |
| 6,005,433 A |   | 12/1999 | Hale ........................... 327/379 |

FOREIGN PATENT DOCUMENTS

| GB | 2 327 544 | 1/1999 |
| JP | 60074816 | 4/1985 |

* cited by examiner

Primary Examiner—Terry D. Cunningham
Assistant Examiner—Long Nguyen
(74) Attorney, Agent, or Firm—Hogan & Hartson L.L.P.

(57) ABSTRACT

The present invention refers to a circuit for current injection control comprising a first transistor having an input terminal, an output terminal and a control terminal, having the characteristic of comprising a second transistor having an input terminal connected to said output terminal of said first transistor, an output terminal and a control terminal and also comprising coupling means placed between said input terminal and said control terminal of said second transistor, said coupling means being active when said first and second transistor are in cut-off zone.

23 Claims, 7 Drawing Sheets

CIRCUIT FOR CURRENT INJECTION CONTROL IN ANALOG SWITCHES

The present invention refers to a circuit for current injection control in analog switches, particularly in switches executed with MOSFET technology.

The MOSFET type analog switches are executed by means of two transistors, one N-Channel and the other P-Channel. The N-Channel transistor is controlled, by means of its own gate electrode, by a first control signal, while the P-Channel transistor is controlled, by means of its own gate electrode, by a second signal equal in amplitude to said first signal but in push-pull.

The analog switches are, for example, used in any N-Channel multiplexer/demultiplexer (or mux/dmux).

The field of application of such devices is, for example, the automobile sector.

For example in the U.S. Pat. No. 6,005,433 (Hale et al.) and in the U.S. Pat. No. 5,111,072 (Seidel et al.) techniques for controlling the charge injection during the turn off phase of an analog switch are described, which load was initially stored during the turn on phase of the switch itself. It therefore concerns a dynamic type of injection control.

In a mux/dmux in order to verify the quantity of current that flows from input to output when all the n−1 switches are turned off and the nth switch is turned on, a particular control sequence is used, which provides for the injection of current in said turned off switches, a sequence which is also known by the name of "current injection control".

In fact said sequence provides for a first phase wherein a current is forced on all the non-active N−1 channels (or switches), a second phase wherein the input of the only enabled channel is connected with a $R_S$ resistor and a third phase wherein the variation of the voltage on the common output channel is controlled.

The operation of current injection in the non-active switches enables said injected current passes through the conductive channel also turning on the switches that are turned off and causing a rise in the voltage present at the output.

In view of the state of the technique described, the object of the present invention is to construct a circuit which with an injected current is capable of preventing said current from passing through the conductive channel of the switch.

In accordance with the present invention, said object is reached by means of a circuit for current injection control comprising a first transistor having an input terminal, an output terminal and a control terminal, characterized in that it comprises a second transistor having an input terminal connected to said output terminal of said first transistor, an output terminal and a control terminal and comprising in addition coupling means placed between said input terminal and said control terminal of said second transistor, said coupling means being active when said first and second transistor are in the cut-off zone.

In addition, said object is also reached by means of a circuit for current injection control comprising a control signal suitable for controlling the operation of a first switch, consisting of a first transistor and a second transistor, the latter having its polarity opposite to said first transistor, characterized in that it comprises a second switch, consisting of a third and fourth transistor with polarity equal to said first and second transistor respectively, controlled by said control signal and connected to said first switch, so that the drain electrodes of said first switch are in common with the source electrodes of said second switch and also comprising a fifth and a sixth transistor polarized in conduction zone only when said control signal is low and having polarity equal to said first and second transistor respectively, controlled by said control signal so that the variation in output current is as low as possible.

Thanks to the present invention a circuit capable of limiting as much as possible the passage of current inside the switch can be constructed.

In addition thanks to the present inventive circuit it is also possible to prevent the parasitic bipolars of the MOSFET transistors composing the analog switch from turning on.

The characteristics and advantages of the present invention will become apparent from the following detailed description of an embodiment thereof, illustrated as non-limiting example in the enclosed drawings, in which.

Figure 1:
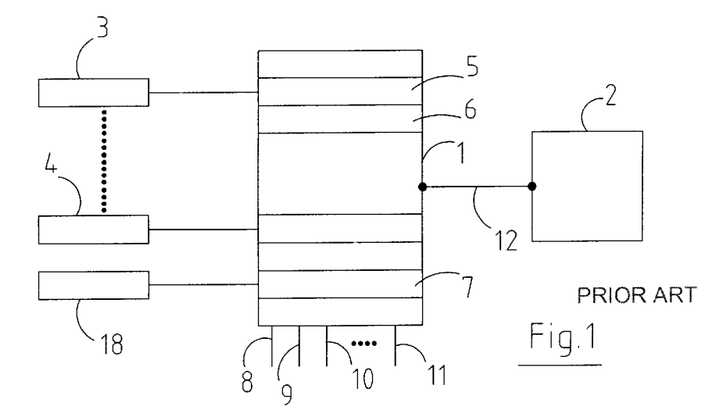
FIG. 1 shows an embodiment of a mux/dmux device according to the known technique.

An embodiment of a mux/dmux 1 device according to the known technique is shown in FIG. 1.

It is known that a multiplexer (o mux) device is composed of $2^n$ input lines, n control lines and 1 output line.

It is also known that the n control lines of the mux select the channel to be placed on the output line between the $2^n$ input lines, enabling only one switch between the $2^n$ switches present.

The mux/dmux 1 has a plurality of input sensors 3, 4 and 18 that are selected through the n control lines 8, 9, 10 and 11. One of such sensors 3, 4 and 18 is connected directly on the output 12 while the others are turned off.

The mux/dmux 1 is connected to a microcontroller 2 which has the task of elaborating the information detected by the sensors 3, 4 and 18.

When one of said sensors 3, 4 and 18 is connected with the microcontroller 2, the voltage value present on the line 12 must be that really detected by the sensors. In the event that this does not happen, that is if there were a variation of voltage on the output line 12 the microcontroller 2 would elaborate mistaken voltage values.

Figure 2:
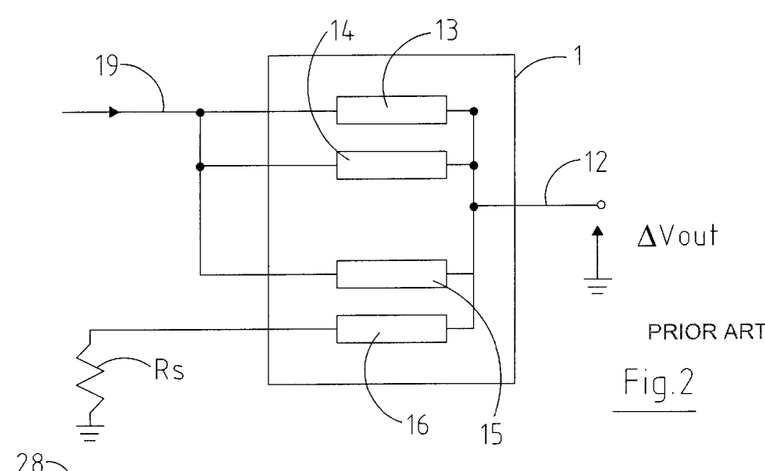
FIG. 2 shows a diagram of a detail of FIG. 1.

A simplified diagram of the mux/dmux 1 is shown in FIG. 2 in accordance with the specification of "current injection control" which provides:

a) To force a current $I_{in}$, via line 19, on all the $2^n-1$ non-active input channels (or switches) 13, 14 and 15;

b) Connect the only active input 16 with a resistor $R_S$;

c) Evaluate the variation in voltage on the output line 12 which must be lower than a predetermined ΔVout so that the microcontroller 2 can correctly elaborate the information placed in output on the line 12.

Figure 3:
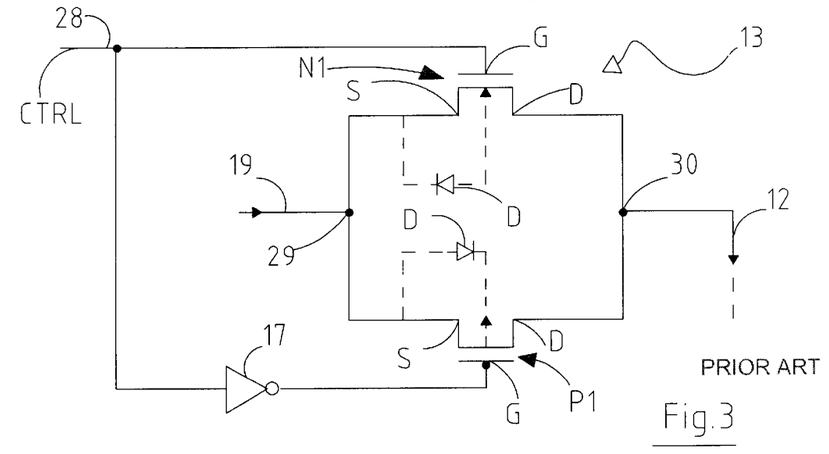
FIG. 3 shows a circuit diagram of a switch according to the known technique.

An electric diagram of a switch used in FIG. 2 is shown in FIG. 3.

According to what is shown in said Figure, assuming that the switch 13 is in the off state, we have for example, that switch 16, shown in FIG. 2 is in the on state, in accordance with what is prescribed by the specification "current injection control".

In fact in said Figure a control line 28 can be seen on which a control signal CTRL is present, representing one of the n control lines 8, . . . , 11 of the mux/dmux 1, suitable for directly controlling the gate or control GN1 of an n type MOSFET N1 transistor and by means of an inverter 17 suitable for controlling the gate or control electrode GP1 of another p type MOSFET P1 transistor.

The inverter 17 is constructed with a technique well known to a technician in this field.

For example the inverter 17 can be constructed by means of two MOSFET transistors one N-Channel and the other P-Channel, having the gate electrodes connected in common and being the n type MOSFET connected to ground and the p type MOSFET connected to a supply line.

In addition it can be seen that the transistors N1 and P1 have in common respectively the source or input electrodes SN1 and SP1, and drain or output electrodes DN1 and DP1, and that said source electrodes are connected to the line 19, representing one of the $2^n$ input lines 3, 4 and 18 of the mux/dmux 1, and that said drain electrodes are connected to an output line 12, representing the common output of all the non-active channels 13, 14 and 15 of the mux/dmux 1.

Therefore the switch device 13 is constructed having the gate electrode GN1 of N1 controlled by the control signal CTRL and the gate electrode GP1 of P1 by the same control signal CTRL but negated by means of the inverter 17, having in common the source electrodes SN1 and SP1 and the drain electrodes DN1 and DP1.

The source electrodes of N1 and P1 therefore also constitute an input terminal 29, while the drain electrodes of N1 and P1 constitute an output terminal 30.

With reference to FIG. 3 when $I_{in}$ is injected on the line 19 in the off channel 13 of the mux/dmux 1 the parasitic diode 20 composed of the source—bulk junction of the transistor P1 is sent in conduction.

The bulk electrode of said transistor is polarized at the supply voltage, for example $V_{DD}$, thus the source electrode SP1 of P1 will go to a tension $V_{DD}+V_K$, where $V_K$ is the tension at the leads of the parasitic diode 20, being $V_K \equiv 0.6 \div 0.8$ V.

In addition, as the gate electrode GP1 of P1 is polarized at $V_{DD}$ there is a tension of $V_{GS}$ enough to turn on the transistor itself permitting, therefore, the passage of a part of the injected current $I_{in}$ through its own channel.

Similar reasoning is to be done also for the other non-active channels 14 and 15.

The passage of a part of the current $I_{in}$ through the channel of the p type transistors on the common output line 12 causes a passage of current also on the resistor $R_S$, as—the channel 16 is active, consequently increasing the potential of the output line.

A similar argument is valid if the direction of the current $I_{in}$ is opposite to that shown in FIG. 3, that is output from the input.

In this case the parasitic diode 21 which is forced to conduct is the bulk—source junction of the transistor N1 and therefore all the n type transistors turned off.

In fact, as the bulk electrode is grounded, the source electrode goes to a voltage $-V_K$.

In addition given that the gate electrode GN1 is grounded, the transistor N1 will enter conduction zone permitting the passage of the current through its own channel, thereby turning on.

Similar reasoning is to be made for the other non-active channels.

Figure 4:
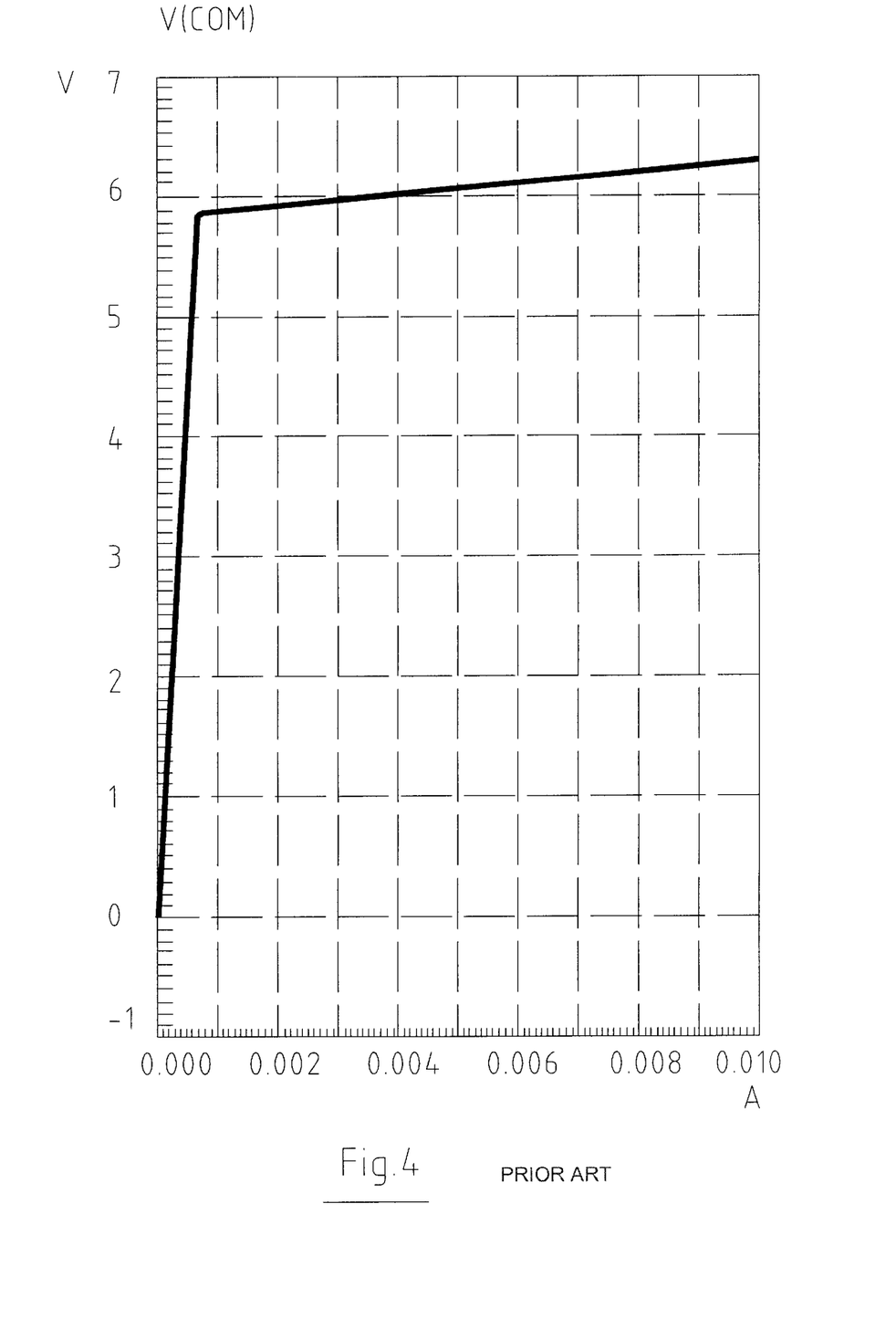
FIG. 4 shows a numeric simulation of the circuit diagram in FIG. 3 in the case of input current.

A numeric simulation of the circuit diagram in FIG. 3 in the case of input current is shown in FIG. 4.

In particular an x-axis indicating the value of the current, expressed in A, present on the line 19, and a y-axis indicating the value of the voltage expressed in V present on the line 12 can be noted.

As can be deduced from the numeric simulation, already in the first phase of current injection, that is between 0 and 0.001 A, the output voltage undergoes the most substantial variation passing from 0V to ≡6V and as the injected current increases the potential of the output line 12 remains substantially still.

Therefore already at modest values of injected current there is a considerable variation in the potential of the output line 12, with consequent wrong reading of the value by the microcontroller 2.

Figure 5:
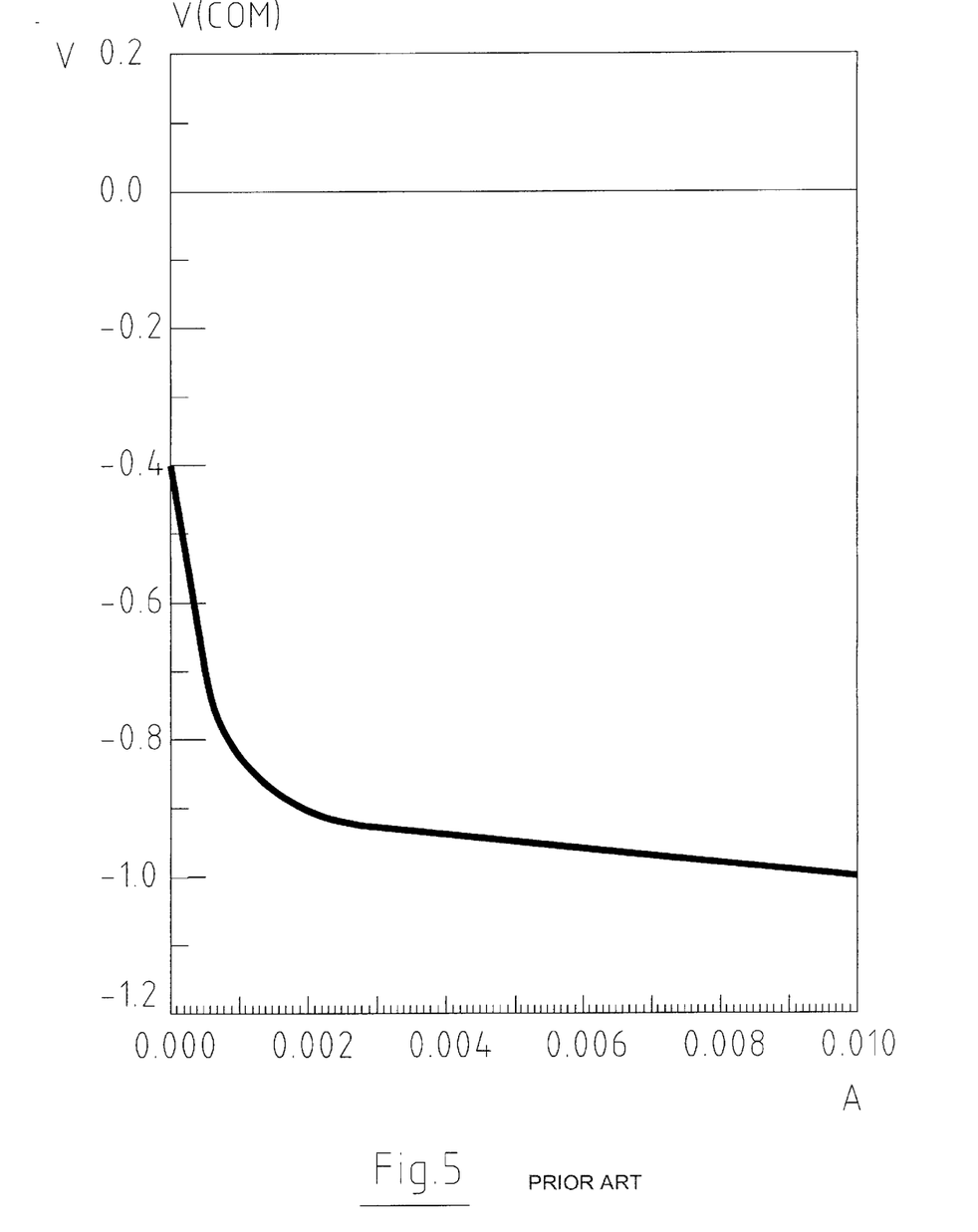
FIG. 5 shows a numeric simulation of the circuit diagram of FIG. 3 in the case of output current.

A numeric simulation of the circuit diagram in FIG. 3 in the case of output current in shown in FIG. 5.

In particular an x-axis indicating the value of the current expressed in A present on the line 19, and a y-axis indicating the value of the voltage expressed in V present on the line 12 can be noted.

As can be deducted from the numeric simulation as the current increases the potential of the output line 12 moves towards the more negative voltages, with consequent incorrect reading of the value by the microcontroller 2.

Figure 6:
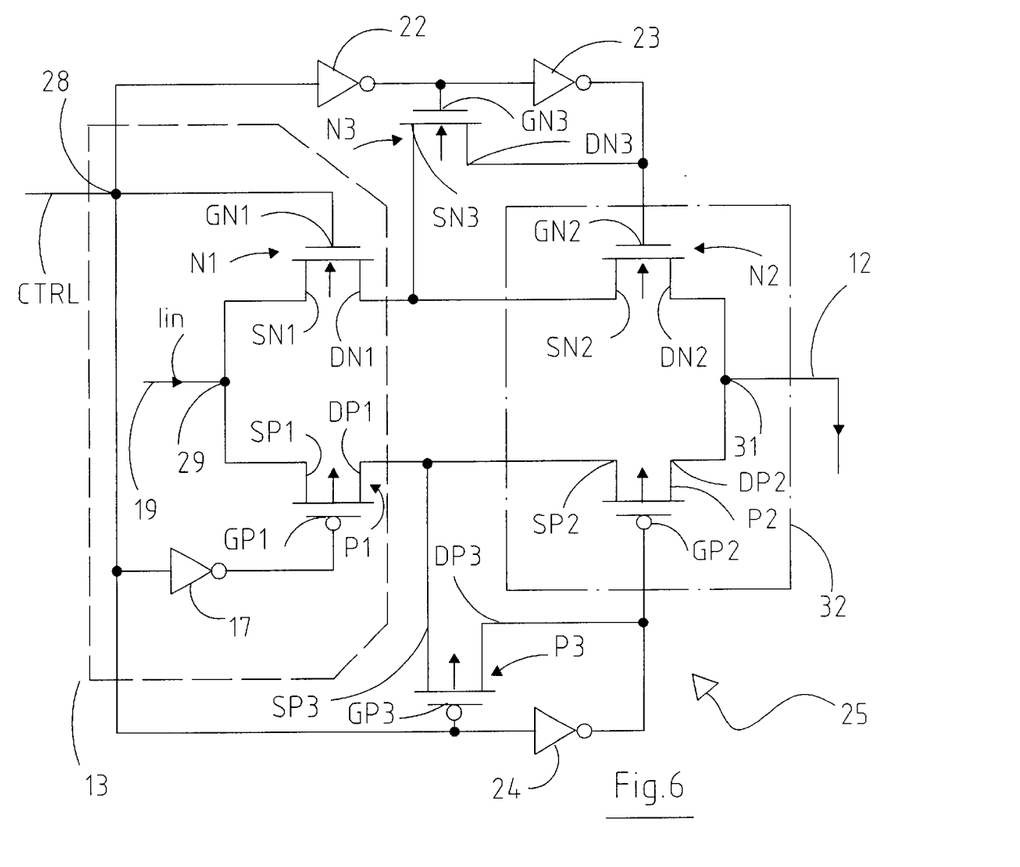
FIG. 6 shows a circuit diagram according to the present invention.

A circuit diagram according to the present invention is shown in FIG. 6.

Indicating the inventive switch with 25, in its overall, in addition to the elements already described in FIG. 3, that is the structure of switch 13, the presence can be noted of a second couple of n type MOSFET N2 and p type MOSFET P2 transistors, these also placed in switch 32 type configuration, having in particular the source or input electrodes SN2 and SP2, of said MOSFET N2 and P2 connected to the drain or output electrodes DN1 and DP1, of said MOSFET N1 and P1.

It can also be seen that the gate or control electrode GN2, of N2 is controlled by the control signal CTRL by means of a pair of inverters 22 and 23.

The inverters 22 and 23 are constructed according to a well known technique, as previously explained for the inverter 17.

The gate electrode GN2 is also connected with the drain or output electrode DN3, of a further n type MOSFET N3 transistor.

Said transistor N3 has the gate or control electrode GN3, controlled by the control line CTRL by means of only the inverter 22, and has the source electrode in common with the source or input electrode SN3, of the MOSFET N2 and with the drain electrode DN1 of the MOSFET N1.

It can also be seen that the gate electrode of P2 is controlled by the control signal CTRL by means of an inverter 24.

The inverter 24 is constructed according to a well known technique, as previously explained for the inverter 17.

The gate electrode GP2 is also connected with the drain or output electrode DP3, of a further p type MOSFET P3 transistor.

Said transistor P3 has the gate or control electrode, GP3, controlled by the control signal CTRL, and the source or input electrode SP3, is in common with the source electrode SP2 of the MOSFET P2 and with the drain electrode DP1 of the MOSFET P1.

In addition the drain electrodes DN2 and DP2 of said transistors N2 and P2 constitute an output terminal 31 of the switch 25.

When the switch is off, that is when on the line 28 a low signal is present, the transistor N3 and the transistor P3 are on so as to bring the voltage of the gate electrodes GP2 and GN2 of the transistors P2 and N2 to the same potential as the respective source electrodes SP2 and SN2, that is $V_{GS}=0$.

In fact, supposing a current $I_{in}$ is forced in input, the transistor P1, having the potential of the gate electrode GP1 at the supply voltage $V_{DD}$, lets a part of the injected current pass, as previously explained. This current however cannot go through the channel of the transistor P2 because, as already described, it has $V_{GS}=0$ therefore it is turned off.

In this manner current does not flow on the common output line 12 and all the more reason on the resistor $R_S$ therefore we have: Vout=$R_S$*$I_S$=0.

This is possible because the paths that the injected current $I_{in}$ will follow, coming from the drain of the transistor P1, are towards the bulk of the transistor P2, which is polarized at the supply voltage $V_{DD}$, passing through the parasitic diode composed of the source—bulk junction (not shown in the Figure), towards the source electrode of the P-Channel transistor (not shown in the Figure) of the inverter 24, which turns out to be on as the line 28 presents a low signal, passing through the channel of the transistor P3, so as to divert the injected current $I_{in}$ towards the supply line $V_{DD}$.

In the event the injected current $I_{in}$ is in output, that is having the opposite direction to that shown in FIG. 6, it is the transistor N1 which, although it has the gate electrode GN1 grounded, lets the current pass, as previously explained.

The transistor N2, therefore, has a voltage $V_{GS}=0$ V and consequently current will not flow through its channel and even less so on the resistor $R_S$.

This is possible because the paths that the current forced in output $I_{in}$, that is in input in the drain of the transistor N1, will follow are towards the bulk electrode of the transistor N2, which is polarized to ground, passing through the parasitic diode composed of the source—bulk junction (not shown in the Figure), towards the source electrode of the N-Channel transistor (not shown in the Figure) of the inverter 23, which proves to be on because the line 28 presents a low signal, passing through the channel of the transistor N3, so as to divert the current in output $I_{in}$ towards the ground line.

Therefore under normal operating conditions when the switch 25 is turned off, the gate electrodes GN2 and GP2 of the transistors N2 and P2 are respectively grounded and at the supply voltage, while the transistors N3 and P3 are turned on.

The transistors N1 and P1 being turned off, therefore, prevent the current from passing (as it would be a short circuit between ground and supply) between the gate electrode GP2 of the transistor P2 and that GN2 of the transistor N2.

Figure 7:
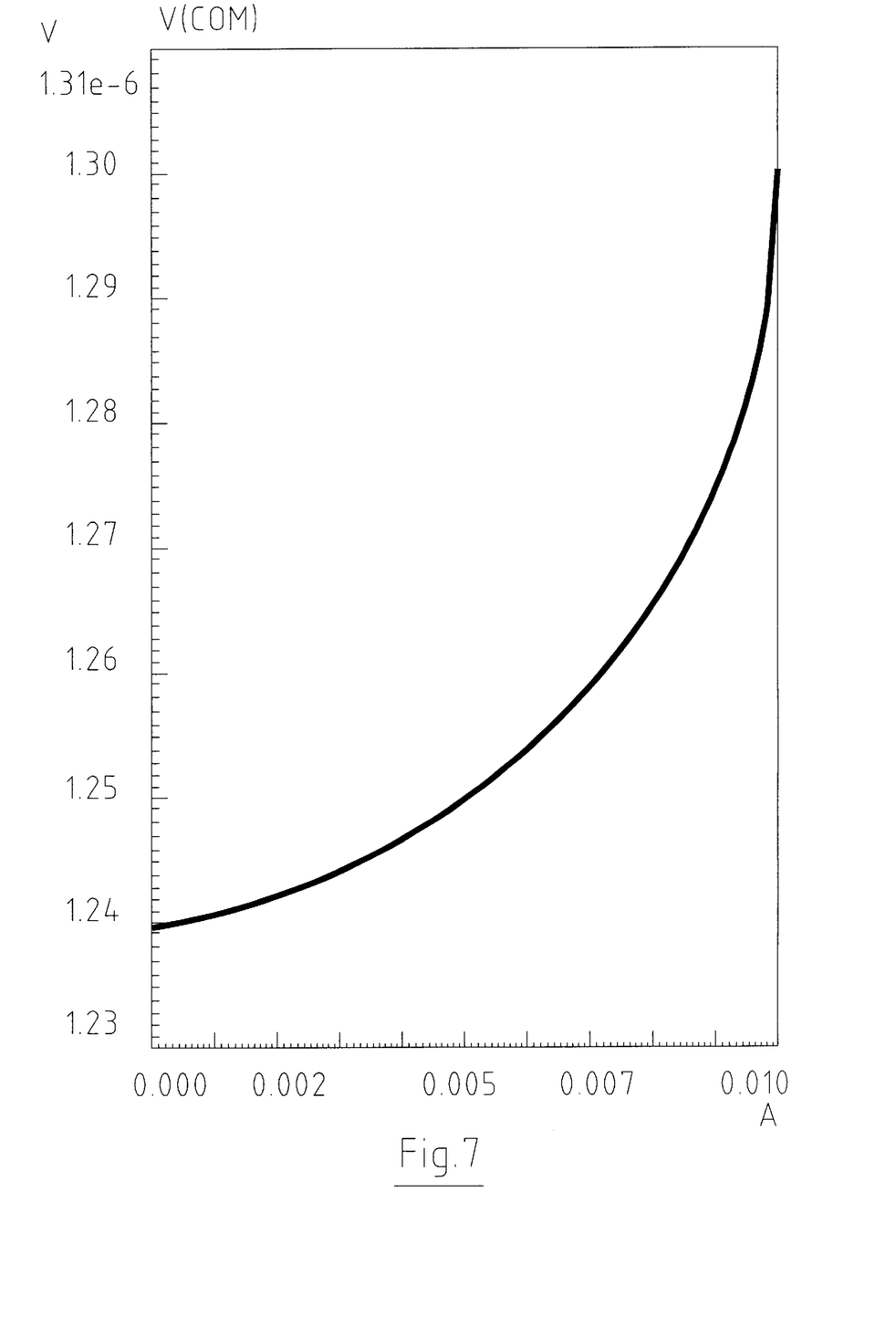
FIG. 7 shows a numeric simulation of the circuit diagram in FIG. 6 in the case of input current.
Figure 8:
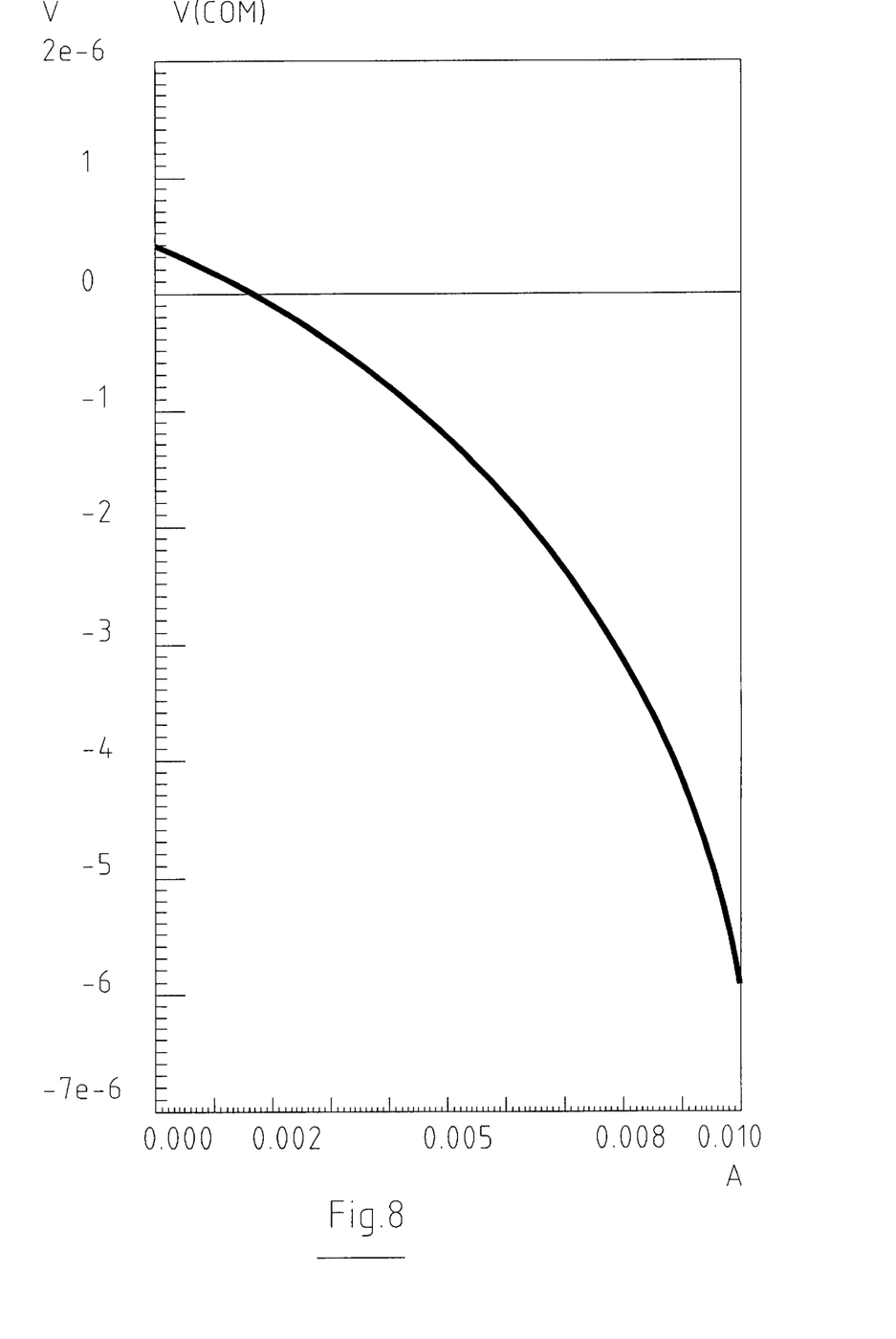
FIG. 8 shows a numeric simulation of the circuit diagram in FIG. 6 in the case of output current.

Two numeric simulations relative to the inventive circuit in FIG. 6 in the case of injected current and current in output respectively, are shown in the FIGS. 7 and 8.

In particular an x-axis indicating the value of the current expressed in A present on the line 19, and a y-axis indicating the value of the voltage expressed in V present on the line 12 can be seen.

As can be deducted from the numeric simulation in comparison to what is shown in the FIGS. 4 and 5 the present invention brings about considerable advantages in the stability of the output voltage of line 12.

In fact in FIG. 7 with 0.01 A injected, the maximum displacement value obtained of the output voltage is about 0.6 $\mu$V.

In fact in FIG. 8 with 0.01 A in output the maximum displacement value of the output voltage is about 6 $\mu$V.

The present invention in addition to preventing the channel of the MOSFET transistors from turning on, as previously explained, it also prevents the parasitic bipolars from turning on.

The inventive circuit thus carries out a function of controlling the effects of the static injection of a current forced from outside.

In fact a secondary effect caused by the injection of current $I_{in}$ is that due to the turning on of the parasitic PNP of the P-Channel transistor (for current in input) and to the turning on of the parasitic NPN of the N-Channel transistor (for current in output) and therefore when current is injected, it flows through the parasitic diode between source and bulk which also represents the emitting—base junction of the parasitic PNP. The parasitic PNP turns on and part of the current can flow through the collector electrode.

Similar argumentation can be made when a current is forced in output. In fact this current will flow from the base electrode towards the emitter electrode of the parasitic NPN, causing it to turn on.

The parasitic bipolar transistor provides as a base and emitter the bulk electrode and the source electrode of the MOSFET transistor respectively.

Figure 9:
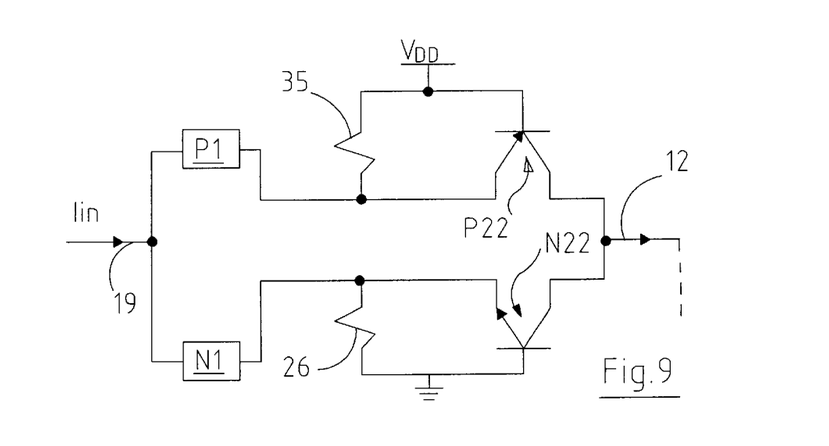
FIG. 9 shows a circuit equivalent to the circuit in FIG. 5.

A diagram equivalent to the circuit in FIG. 6 is shown in FIG. 9.

In said Figure indicating with 35 the resistor resulting from the series between the turn on resistor of the transistor P3 and of the P-Channel transistor of the inverter 24 (not shown in the Figure) and indicating with 26 the resistor resulting from the series between the turn on resistor of the N3 transistor and of the N-Channel transistor of the inverter 23 (not shown in the Figure) and indicating with N22 and P22 the parasitic bipolars of the MOSFET transistors N2 and P2, by suitably sizing, that is acting on their turn on resistor, it can be made in a such a way that the base emitter voltages remain below the turn on threshold of the parasitic bipolars themselves, when a certain current is injected $I_{in}$.

If for example $I_{in}$ is the injected current and I is the current in output from the drain electrode of the transistor P1, as $V_{BE} < R_{onP3} * I_{in}$ will size $R_{onP3}$ so that it is $R_{onP3} < 0.5 * I_{in}$.

The same goes for the sizing of N3.

In addition, the present invention is applicable to an analog switch with "body compensation" on the MOSFET transistors both with N-Channel and P-Channel.

Figure 10:
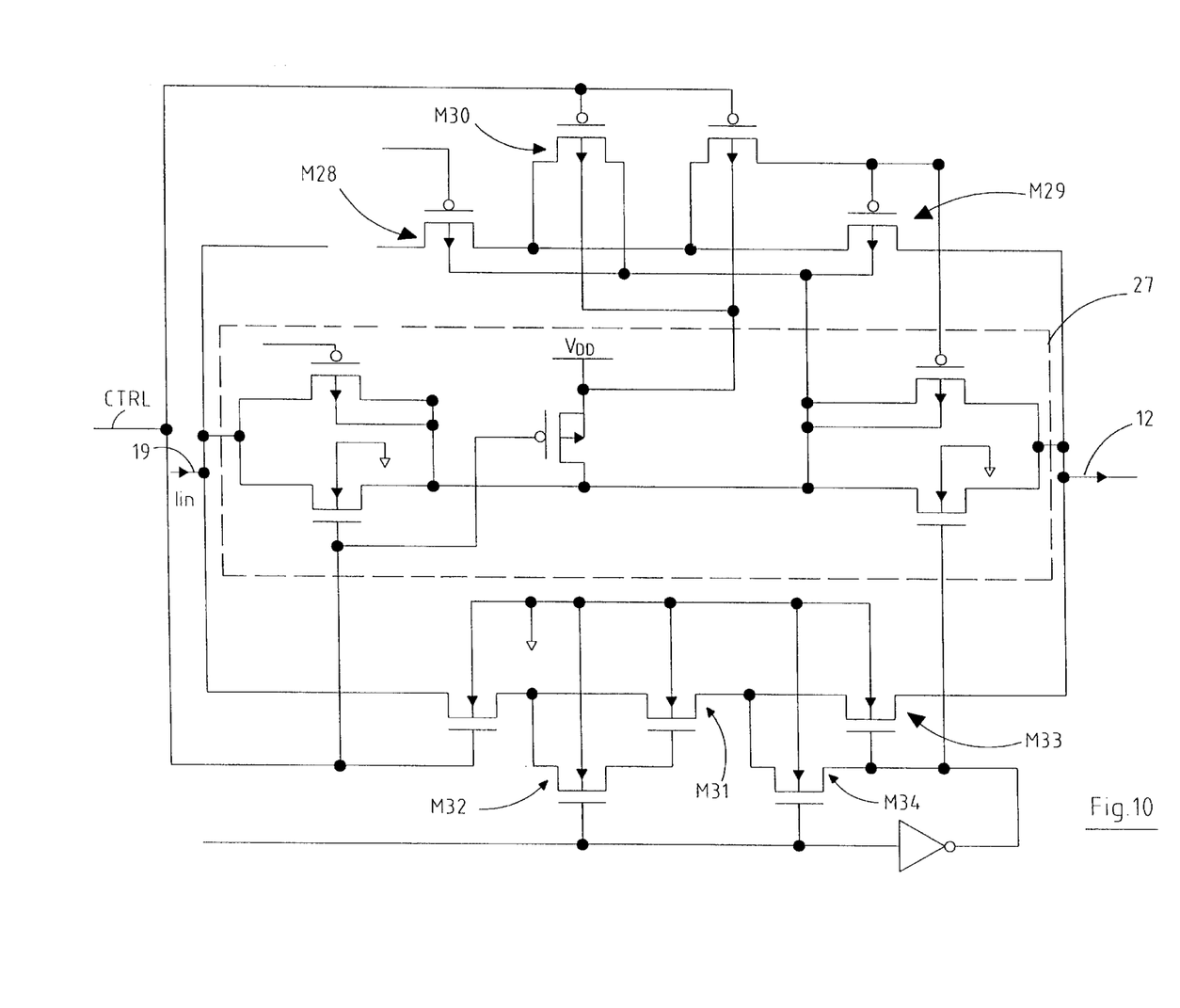
FIG. 10 shows an application of the circuit according to the present invention.

In fact an application of the circuit according to the present invention is shown in FIG. 10.

In said Figure an analog switch is schematized with a circuit of "body compensation" 27 on the P-Channel transistor because in this specific example the technology is p-substrate.

The circuit 27 serves to bring the bulk electrode of the transistors MOSFET M28 and M29 to a voltage near the voltage present on the input line 19 and on the output line 12, thus reducing the bulk effect when the switch is turned on.

To improve the control of the effects of the current injection a P-Channel MOSFET transistor M30 has been added which connects the bulk electrodes of the MOSFET M28 and M29 to the drain electrode of the MOSFET M29 when the switch is turned off.

This circuit device greatly reduces the base emitter voltage to the leads of the parasitic bipolar of the MOSFET M29.

In the event the technology does not permit the execution of the same circuit operation for N-Channel devices, the hook of the parasitic NPN is improved by placing in series two couples of N-Channel transistors.

In fact two further couples of MOSFET transistors M31 and M32 and M33 and M34 are shown in FIG. 10.

In this manner even if the first parasitic PNP lets a certain quantity of current pass the second parasitic bipolar will have a base emitter voltage which is much less in comparison to the first parasitic bipolar and therefore this will not permit the passage of current.

The same goes for the technologies with n substrate.

What is claimed is:

1. A circuit for current injection control comprising:
   a first transistor having an input terminal, an output terminal and a control terminal;
   a second transistor having an input terminal connected to said output terminal of said first transistor, an output terminal and a control terminal;
   coupling means placed between said input terminal and said control terminal of said second transistor, said coupling means being active when said first and second transistors are in the cut-off zone;
   a third transistor having an input terminal connected with said input terminal of said first transistor, an output terminal and a control terminal;
   a fourth transistor having an input terminal connected to said output terminal of said third transistor, an output terminal and a control terminal; and
   further coupling means placed between said input terminal and said control terminal of said fourth transistor, said further coupling means being active when said third band fourth transistors are in the cut-off zone.

2. The circuit according to claim 1, wherein said coupling means comprises a fifth transistor having an input terminal connected with the output terminal of said first transistor and with the input terminal of said second transistor, an output terminal connected with the control terminal of said second transistor and a control terminal.

3. The circuit according to claim 2, wherein said further coupling mean is a sixth transistor having an input terminal connected with the output terminal of said third transistor and with the input terminal of said fourth transistor, an output terminal connected with the control terminal of said fourth transistor said a control terminal.

4. The circuit according to claim 2, wherein the control terminal of said first transistor is connected with a control line, the control terminal of said fifth transistor is connected with said control line by means of a first inverter and the control terminal of said second transistor is connected to said control line by means of the series of said first inverter and of a second inverter.

5. The circuit according to claim 4, wherein the control terminal of said third transistor is connected with said control line by means of a third inverter, the control terminal of said sixth transistor is connected with said control line and the control terminal of said fourth transistor is connected to said control line by means of a fourth inverter.

6. The circuit according to claim 1, wherein said first and third transistors form a first analog switch.

7. The circuit according to claim 1, wherein said second and fourth transistors form a second analog switch.

8. The circuit according to claim 1, wherein said input terminals of said first and third transistors comprise an input node for an injection current.

9. The circuit according to claim 1, wherein said output terminals of said second and fourth transistors comprise an output node of a common output line for said injection current.

10. The circuit according to claim 2, wherein said first, second and fifth transistors comprise N-Channel MOSFET transistors.

11. The circuit according to claim 3, wherein said third, fourth and sixth transistors comprise P-Channel MOSFET transistors.

12. A circuit for current injection control comprising:
    a control signal suitable for controlling the operation of a first switch, consisting of a first transistor and a second transistor, the latter having a polarity opposite to said first transistor;
    a second switch, consisting of third and fourth transistors of equal polarity to said first and second transistors respectively, controlled by said control signal and connected to said first switch, so that drain electrodes of said first switch are common with source electrodes of said second switch; and
    a fifth and a sixth transistor polarized in the conduction zone only when said control signal is low and having equal polarity to said first and second transistors respectively, controlled by said control signal so that the output current is as low as possible.

13. A circuit for current injection control comprising:
    a first transistor having an input terminal, an output terminal and a control terminal;
    a second transistor having an input terminal connected to said output terminal of said first transistor, an output terminal and a control terminal;

coupling means placed between said input terminal and said control terminal of said second transistor, said coupling means being active when said first and second transistors are in the cut-off zone by making the potential on the input and control terminals of the second transistor substantially equal;

a third transistor having an input terminal connected with said input terminal of said first transistor, an output terminal and a control terminal;

a fourth transistor having an input terminal connected to said output terminal of said third transistor, an output terminal and a control terminal; and further coupling means placed between said input terminal and said control terminal of said fourth transistor, said further coupling means being active when said third and fourth transistors are in the cut-off zone.

14. The circuit according to claim 13, wherein said coupling means comprises a fifth transistor having an input terminal connected with the output terminal of said first transistor and with the input terminal of said second transistor, an output terminal connected with the control terminal of said second transistor and a control terminal.

15. The circuit according to claim 14, wherein said further coupling means is a sixth transistor having an input terminal connected with the output terminal of said third transistor and with the input terminal of said fourth transistor, an output terminal connected with the control terminal of said fourth transistor and a control terminal.

16. The circuit according to claim 14, wherein the control terminal of said first transistor is connected with a control line, the control terminal of said fifth transistor is connected with said control line by means of a first inverter and the control terminal of said second transistor is connected to said control line by means of the series of said first inverter and of a second inverter.

17. The circuit according to claim 15, wherein the control terminal of said third transistor is connected with said control line by means of a third inverter, the control terminal of said sixth transistor is connected with said control line and the control terminal of said fourth transistor is connected to said control line by means of a fourth inverter.

18. The circuit according to claim 13, wherein said first and transistors form first analog switch.

19. The circuit according to claim 13, wherein said second and fourth transistors form a second analog switch.

20. The circuit according to claim 13, wherein said input terminals of said first and third transistors comprise an input node for an injection current.

21. The circuit according to claim 13, wherein said output terminals of said second and fourth transistors comprise an output node of a common output line form said injection current.

22. The circuit according to claim 14, wherein said first, second and fifth transistors comprise N-Channel MOSFET transistors.

23. The circuit according to claim 15, wherein said third, fourth and sixth transistors comprise P-Channel MOSFET transistors.

* * * * *